MONOLITHIC SEMICONDUCTOR DEVICES

Filed May 2, 1960 2 Sheets-Sheet 1

WITNESSES

Robert C. Baird

Charles L. Menzemer

INVENTOR

Walter Ziffer.

BY

Frederick Shapoe

ATTORNEY 3,110,870

MONOLITHIC SEMICONDUCTOR DEVICES

Walter Ziffer, Clairton, Pa., assignor to Westinghouse Electric Corporation, East Pittsburgh, Pa., a corporation of Pennsylvania Filed May 2, 1960, Ser. No. 26,327
7 Claims. (Cl. 331—113)

This invention relates to a semiconductor device, and more particularly to a monolithic semiconductor device and particularly an astable multivibrator or pulse generator contained in a unitary body of a semiconductor material.

Astable or free running multivibrators were first made employing vacuum tubes based on the Eccles-Jordan circuit. With the advent of the transistor, the Eccles-Jordan circuit was modified and transistors have been substituted for vacuum tubes. Transistors have certain properties which make their substitution for vacuum tubes in multivibrator circuits desirable. For example, transistors are smaller, more rugged than vacuum tubes, require no filament power, operate at a low supply voltage, dissipate relatively little power, and ordinarily have a service life much longer than that of a heated filament vacuum tube. However, even a transistorized astable multivibrator circuit is relatively complex and requires the connecting of various separate components, for example, transistors, capacitors and resistances with a plurality of conductors. In addition, such a circuit requires some twenty-odd soldered connections, all of which are potential points of circuit failure during operation, especially when the multivibrator is subject to an unusual operating environment, such for example, as is found in a rocket or missile.

An object of the present invention is to provide an astable multivibrator or pulse generator comprising cooperating portions made up of p-n junctions, energy storage regions, and resistances or other impedance means all within one unitary or monolithic body of a semiconductor material, these portions being electrically connected through the bulk of the semiconductor material without any external leads between the several portions.

Another object of the present invention is to provide a monolithic semiconductor device comprising, within a unitary body of a semiconductor material, a plurality of active regions, a plurality of energy storage regions, said energy storage regions comprising reverse biased junctions; and dissipative regions, all provided in the body of the material and electrically cooperative, whereby each of said active regions is astable and regenerative, said active regions and energy storage regions being electrically interconnected through the body of the material.

Another object of the present invention is to provide a single unitary semiconductor member having a plurality of interrelated doped regions including p-n junctions, and conductive portions, the regions being electrically connected through the bulk of the semiconductor member, the whole being capable of cooperating to function as an astable multivibrator or pulse generator.

A still further object of the present invention is to provide a single unitary semiconductor member having a plurality of interrelated doped regions including p-n junctions and conductive portions, certain conductive portions functioning both as ohmic contacts and in a capacitive function, the regions being electrically connected through the bulk of the semiconductor member, the whole cooperating to function as an astable multivibrator or pulse generator.

Other objects of the present invention will, in part, appear hereinafter and will, in part, be obvious.

For a better understanding of the nature and objects of the present invention, reference should be had to the following detailed description and drawings, in which.

Figure 8:
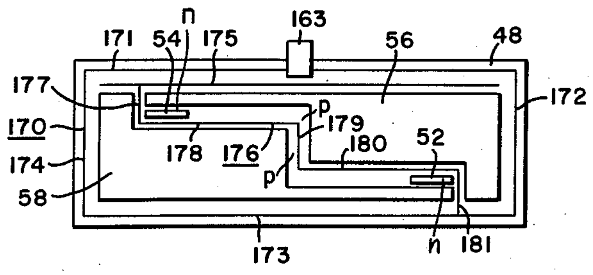
Figure 9:
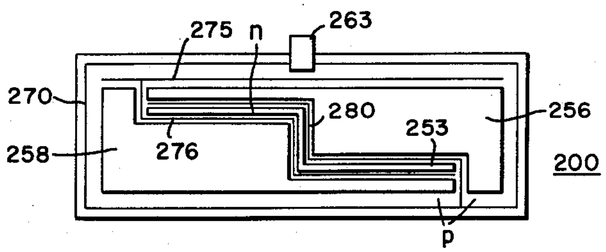
Figure 10:
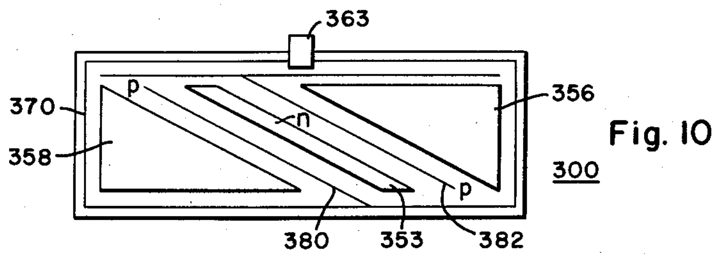
Figure 11:
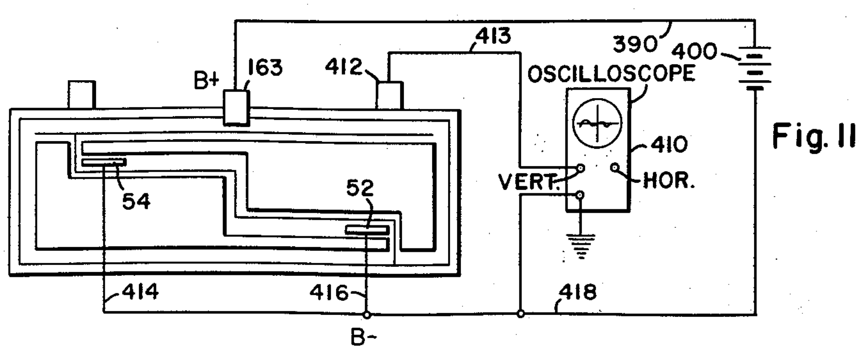

FIGS. 8 to 10, inclusive, are top views of several different astable multivibrators prepared in accordance with the teachings of this invention; and FIG. 11 is a schematic view of the semiconductor device of this invention in circuit with a power source and load.

In accordance with the present invention and attainment of the foregoing objects there is provided a monolithic semiconductor device comprising, within a unitary body of a semiconductor material, a plurality of active regions, each of said active regions being unstable and regenerative in function, a plurality of energy storage regions, said energy storage regions comprising reverse bias junctions, and dissipative regions, said active regions and energy storage regions being interconnected through the body of the material. The only external leads required in the device are power input leads and output leads. Such device is particularly suitable for use as an astable multivibrator or pulse generator and the description hereinafter will be primarily directed thereto.

The astable multivibrator or pulse generator of this invention so prepared functions essentially as a nonsinusoidal two-stage oscillator in which one stage conducts while the other is cut off until a point is reached at which the stages reverse their conditions. That is, the stage which had been conducting cuts off, and the stage that had been cut off conducts. For explanatory purposes in connection with such functioning reference should be had to FIG. 1 which is the well known Eccles-Jordan circuit. While the two transistors $T_1$ and $T_2$ are similar, because of variation in tolerance of the circuit components, one transistor will conduct before the other or will conduct more heavily than the other. Therefore, assume that when a voltage is introduced at B+ transistor $T_1$ initially conducts a higher current between its collector and emitter than does transistor $T_2$. As a result, the voltage at point 22 becomes less positive than the B+ voltage. The voltage at point 26 also becomes less positive and the current between the collector and emitter of transistor $T_2$ will decrease. As a result, the voltage across resistance $R_4$ drops and the voltage at point 28 becomes more positive. The voltage at point 24 will then become more positive and the current through the collector and emitter of transistor $T_1$ will increase still further. This cycle will continue until the current through transistor $T_1$ is at a maximum and the current through transistor $T_2$ is negligible. As the current in transistor $T_1$ is at a maximum, the capacitor $C_2$ will charge from B+ voltage source through the resistance $R_3$ until the base of transistor $T_2$ is sufficiently positive with respect to the emitter of transistor $T_2$ to start a conduction of current in the transistor $T_2$. The current in transistor $T_2$ will cause the voltage at point 28 to become less positive. The voltage at point 24 will become less positive and as a result the current through transistor $T_1$ will decrease. The decrease in the current through $T_1$ will cause the voltage at point 22 to become more positive. The voltage change at point 22 will be applied to the base of transistor $T_2$ at point 26 and the current through transistor $T_2$ will increase still further. This cycle will continue until the current through transistor $T_2$ is at a maximum and the current through transistor $T_1$ is at a minimum. Current conduction will be initiated in transistor $T_1$ again by the capacitor $C_1$ charging from voltage source B+ through resistor $R_2$ until the base of transistor $T_1$ is sufficiently positive to initiate a current flow from the collector to the emitter in transistor $T_1$ again. If an oscilloscope is connected between point 22 and a point of negative supply voltage B− a square wave pulse of the type illustrated in FIG. 2 will be displayed on the scope.

Figure 1:
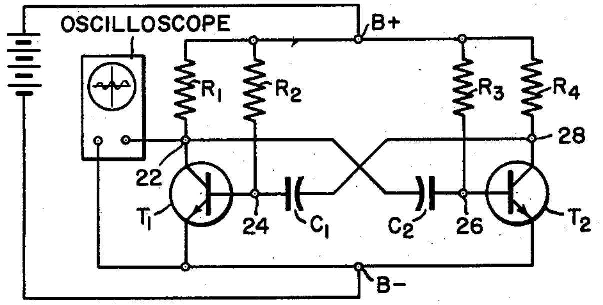
Fig. 1. PRIOR ART
FIGURE 1 is a schematic view of an Eccles-Jordan transistorized astable multivibrator circuit.

In accordance with the teachings of this invention, this entire RC-oscillation function of the device of FIG. 1, can be built into a unitary monolithic body of a semiconductor material eliminating all leads except input and output leads. Further, the functions only of the known components are present in this monolithic device.

For the purpose of clarity, the present invention will be described specifically in terms of preparing an astable or free running multivibrator or pulse generator in a semiconductor silicon body. It will be understood, however, that in addition to silicon, other semiconductor materials, for example germanium, silicon carbide or a semiconducting compound comprised, for example, of stoichiometric proportions of elements from group III of the periodic table, for example gallium, aluminum and indium, and elements from group V, for example arsenic, phosphorus and antimony. Examples of suitable III–V stoichiometric compounds include gallium arsenide, gallium antimonide, gallium phosphide, indium arsenide and indium antimonide. It will be understood that the silicon or other semiconductor may be processed so that the semiconductivity of the various regions may be reversed in preparing the devices.

Figure 3:
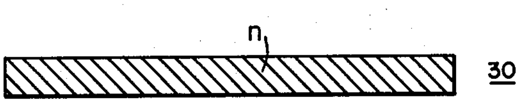
FIGS. 3 and 4 are side views in cross section of a wafer of a semiconductor material being processed in accordance with the teachings of this invention.

With reference to FIG. 3, there is illustrated a single crystal silicon wafer 30 of n-type semiconductivity. The wafer 30 may be prepared by any of the methods known to those skilled in the art, for example, a single-crystal silicon rod may be pulled from a melt comprised of silicon and at least one element from group V of the periodic table, for example, arsenic, antimony or phosphorus. The wafer 30 is then cut from the rod with, for example, a diamond saw. The surface of the wafer may then be lapped or etched or both to produce a smooth surface after sawing. In addition, the semiconductor device of this invention may be prepared from section of a dendritic crystal prepared in accordance with U.S. patent application Serial No. 844,288, filed October 5, 1959, the assignee of which is the same as that of the present invention.

The wafer 30 should preferably have a resistivity of from 10 ohm-cm. to 100 ohm-cm. and preferably about 50 ohm-cm. Since the bulk of the wafer makes up the dissipative or resistance regions of the finished device it is desirable that the wafer have a resistivity within this range. The area of the block is largely determined by the required capacitance of the reverse biased junctions which in turn depends on the desired oscillating frequency of the multivibrator. The higher the frequency the smaller the possible size of the device.

The wafer 30 is disposed in a diffusion furnace. The hottest zone of the furnace is at a temperature within the range of 1100° C. to 1250° C. and has an atmosphere of the vapor of an acceptor doping material, for example, indium, gallium, aluminum or boron. The zone of the furnace within which a crucible of said acceptor impurity lies may be at a temperature of from 600° C. to 1250° C., the specific temperature being chosen to ensure the desired vapor pressure and surface concentration of diffusant from the crucible. The acceptor impurity diffuses into the surface of the n-type wafer. Since the acceptor impurity will normally diffuse through all sides of the wafer it may be necessary to mask the sides or other surfaces, through which no diffusion is desired. The acceptor impurity may be allowed to diffuse through all the surfaces of the wafer, and then the wafer abraded or etched, or both remove the diffused layer from the undesired portions of the wafer.

Figure 4:
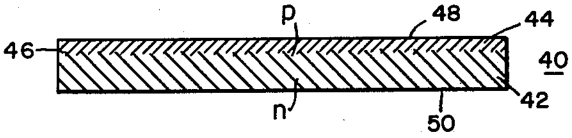

With reference to FIG. 4, there is illustrated a wafer 40 which is the n-type wafer of FIG. 3 after diffusion, in which a doping impurity is diffused through only the top surface of the wafer, or where the diffused layer has been removed from all but the top portion of the wafer. The wafer 40 is comprised of an n-type region 42 and a p-type region 44 comprising the diffused impurity area. There is a p-n junction 46 between the regions 42 and 44. The wafer 40 comprises a top surface 48 and a bottom surface 50.

The depth or thickness of region 44 is dependent primarily upon the desired design characteristics of the completed astable multivibrator or pulse generator. In addition, it must be deep enough to permit the alloying or fusion of additional contacts therewith without penetration through the p-type region 44 so as to reach the n-type region 42. A depth of approximately .08 mil has been found to be satisfactory in a wafer having a total thickness of about 7 mils.

Figure 5:
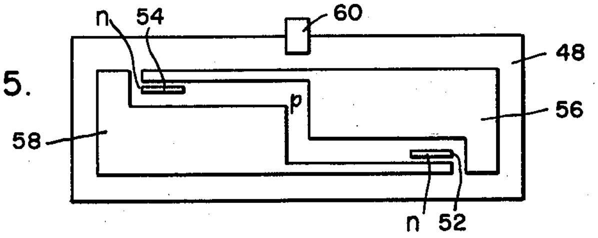
FIG. 5 is a top view of a wafer of semiconductor material being processed further in accordance with the teachings of this invention.

With reference to FIG. 5, emitter portions 52 and 54 of n-type semiconductivity, ohmic contacts 56 and 58 of p-type semiconductivity, and ohmic contact 60, which is comprised of a neutral metal preferably gold, and a p-type doping material, are formed on the top surface 48 of the wafer 40 by disposing the respective material, preferably in the form of shaped foils, upon the top surface 48 and alloying or fusing the foils to the surface 48 by heating in a vacuum of at least $10^{-2}$ mm. Hg, and preferably higher for example $10^{-5}$ mm. Hg, at a temperature of from 400° C. to 700° C.

The emitter portions 52 and 54 may be formed from, for example, a foil comprised of at least one suitable n-type material, for example, antimony, arsenic and phosphorus, or the foil may be comprised of an alloy of a neutral metal, for example, gold, and at least one n-type doping material. Examples of suitable emitter alloys include an alloy comprised of from 99.0% to 99.5% gold, and 1% to 0.5% antimony.

The p-type ohmic contacts 56 and 58 may be formed from, for example, a layer comprised of at least one suitable p-type material, for example, boron, aluminum, gallium or indium, or the layer may be in the form of a foil comprised of an alloy of a neutral metal, for example, gold and at least one p-type doping material. Examples of suitable alloys include a gold 0.1% boron alloy.

The ohmic contact 60 may be formed from a foil comprised of a neutral metal, preferably gold and a p-type doping material, preferably boron. It will be noted that a portion of the foil extends over the edge of top surface 48 of wafer 40, the purpose of this will be discussed hereinafter.

A suitable thickness of the foils employed to form the emitters 52 and 54 and the contacts 56 and 58 can be determined from a component phase diagram and the thickness of the region 44. In this case, where the region 44 is approximately 0.7 mil thick gold foil thickness of from 0.75 mil to approximately 1.5 mils, preferably about 1 mil has been found to be satisfactory.

The temperature at which the foils are alloyed to the wafer depends to a degree upon the composition of the foils. If no aluminum is present the fusion or alloying can be carried out at a temperature as low as 400° C. However, if the contacts 56 and 58 contain a relatively high percentage of aluminum a temperature of about 600° C. is required.

Figure 6:
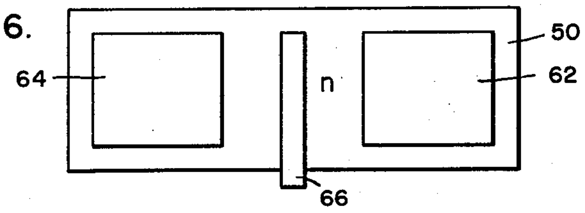
FIG. 6 is a bottom view of a wafer of semiconductor material being processed further in accordance with the teachings of this invention.

With reference to FIG. 6, during the alloying and fusion of emitters 52 and 54 and ohmic contacts 56 and 58 and the contact 60 to the top surface 48 of the wafer 40, n-type ohmic contacts 62 and 64 and ohmic contact 66 are fused to the bottom surface 50 of the wafer 40. The contacts 62 and 64 may be formed from, for example, a layer comprised of at least one suitable n-type material, for example, antimony, arsenic or phosphorus, or the layer may be in the form of a foil comprised of an alloy of a neutral metal, for example, gold and at least one of the n-type doping materials. Examples of suitable contact alloys include an alloy comprised of gold and 0.5% antimony.

The contact 66 is formed from a foil comprised of the same base material as the contact 60, preferably gold, and an n-type doping material. It will be noted that a portion of the foil extends over the edge of surface 50 on the same side of the wafer that contact 60 projected over. During the fusion, the foil 60 alloys with region 44 and forms an ohmic contact therewith. Foil 66 alloys with region 42 and forms an ohmic contact therewith. The portion of foil 60 extending over the edge of top surface 48 and that portion of foil 66 extending over the edge of bottom surface 50 flow together to form a continuous contact denoted as 163 in FIG. 8, along the side of the wafer. The use of gold and a doping material to form contact 163 ensures a good ohmic contact between the wafer and contact, and provides a method whereby the fusion can be carried out well below the melting point of gold.

It will be understood, of course, that the fusion and alloying step described immediately hereinabove can be carried out in a jig or other suitable apparatus to ensure that the various foils remain in position during the fusion and alloying.

Figure 7:
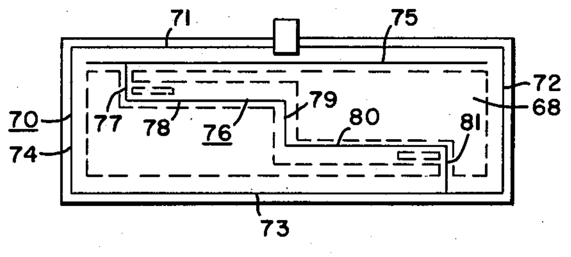
FIG. 7 is a top view of a wafer of semiconductor material being still further processed in accordance with the teachings of this invention.

With reference to FIG. 7, the top surface 48 of the wafer 40 is then coated with an acid resisting masking material 68, for example, Apiezon wax. A first line 70, comprised of segments 71, 72, 73 and 74 is scribed entirely through the wax about the edge of surface 48 of the wafer 40. A second line 75 is scribed entirely through the masking material substantially parallel to, an inside of segment 71 of line 70. A third line 76 comprised of segments 77, 78, 79, 80 and 81 is scribed entirely through the mask and intersects and terminates at line 75 and segment 73 of line 70. The coated surface 48 of the wafer 40 is then etched with a suitable silicon etchant, for example, an etchant comprised of, all parts by volume, 3 parts nitric acid, 1 part hydrofluoric acid and 1 part acetic acid. The etching is continued until the scribed lines are etched entirely through the p-type region 44 whereby grooves are present at these portions. The etching is then terminated and the masking material 68 removed from the top surface 48 of the wafer 40. Other means for producing grooves other than by etching may be employed. Thus, sand blasting through suitable masks may be resorted to.

With reference to FIG. 8, there is illustrated a top view of top surface 48 of the wafer 40 after etching. A groove formed by an etched line 170, having segments 171, 172, 173 and 174, extends entirely through the p-type region 44 to n-type region 42. The etched line 170 extends about the periphery of the wafer 40 on surface 48 beginning and terminating at opposite sides of the gold ohmic contact 163. A second groove comprising an etched line 175 extends entirely through the p-type region 44 to n-type region 42. The etched line 175 is parallel to and inside of segment 171 of the etched line 170, and terminates short of segments 172 and 174 of line 170. A third groove comprising an etched line 176, having segments 177, 178, 179, 180 and 181 passes entirely through the p-type region 44 to n-type region 42 and extends from line 175 to segment 173 of etched line 170. Segment 177 of line 176 extends substantially perpendicular from line 175 and passes between a portion of ohmic contacts 56 and 58 and separates emitter 54 from ohmic contact 58. Segment 178 of line 176 intersects segment 177 of line 176 and is substantially parallel to line 176. Segment 178 separates ohmic contact 58 from emitter 54 and ohmic contact 56. Segment 180 of line 176 intersects and is substantially perpendicular to segment 179 of line 176. Segment 180 is substantially parallel to segment 178. Segment 180 separates ohmic contact 56 from emitter 52 and ohmic contact 58. Segment 181 of line 176 intersects segment 180 of line 176. Segment 181 extends between segment 180 of line 176 and segment 173 of line 170. In summary, the etched lines separate or insulate the emitter 54 and ohmic contact 56 from the ohmic contact 58 and emitter 52 through the p-type region 44. The bottom surface of the processed wafer corresponds to that illustrated in FIG. 6. The processed wafer is now a molecularized or monolithic astable or free running multivibrator or pulse generator built within a unitary body of semiconductor material with no external leads except input and output leads.

The astable multivibrator or pulse generator is comprised functionally of two transistor areas which operate as active, unstable regenerative regions, ohmic contacts 56 and 58 which are paired with ohmic contacts 62 and 64, respectively, to form, contacts for the reverse biasing of p-n junction 46, which reversed bias junction forms energy storage regions, and the bulk of the semiconductor material which forms the dissipative regions. The dissipative regions providing the functions of the resistors $R_1$, $R_2$, $R_3$ and $R_4$ of FIG. 1 are as follows:

$R_1$—the portion of the semiconductor wafer 40 on the bottom surface 50 between the contacts 64 and 66 in FIG. 6;

$R_2$—the portion of the p-type region 44 between the contacts 56 and 163 in FIG. 8;

$R_3$—the portion of the p-type region 44 between the contacts 58 and 163 in FIG. 8;

$R_4$—the portion of the semiconductor wafer 40 on the bottom surface 50 between the contacts 62 and 66 in FIG. 6.

The paths of carriers between the various regions is controlled by the etched lines 70, 75 and 76. N-type emitters 52 and 54 are the emitters of the respective transistor areas, the p-type region 44 forms the base region of the two transistors and the n-type region 42 forms the collector region of the two transistors. There is, of course, a p-n junction between each of the n-type emitters 52 and 54 and the p-type region 44. There is also a p-n junction 46 between p-type region 44 and n-type region 42.

While the preparation of the astable multivibrator device or pulse generator of this invention has been described relative to one particular configuration, it will be appreciated that this is merely illustrative and that other suitable configurations are possible.

For example, and with reference to FIG. 9, there is illustrated a top view of a modified molecularized astable multivibrator or pulse generator device 200. The top surface of the wafer comprising the device 200 has disposed thereon two ohmic contacts 256 and 258, a gold contact 263 and an emitter 253. The composition of the ohmic contacts 256 and 258 and emitter 253 is in accordance with the teachings set forth hereinabove. Grooves comprising etched lines 270, 275, 276 and 280 separate the various regions as described hereinabove. The bottom surface of the device 200 is substantially identical with that shown in FIG. 6.

With reference to FIG. 10, there is illustrated a top view of a modification of a monolithic astable multivibrator device 300. The top surface of the wafer comprising the device 300 has disposed thereon two ohmic contacts 356 and 358, a gold contact 363, and an emitter 353. The composition of the ohmic contacts and emitter is in accordance with the teachings set forth hereinabove. Etched lines 370, 380 and 382 separate the various regions as described hereinabove. The bottom surface of the device 300 is substantially identical with that shown in FIG. 6.

Figure 2:
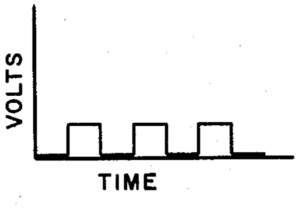
FIG. 2 is a plot of a square wave pulse generated by the circuit of FIG. 1.

With reference to FIG. 11, if the device of FIG. 8 is connected in series by a conductor 390 with a power source 400, for example a battery, with the positive terminal connected to contact 163 and the negative terminal to the emitters 52 and 54, and an oscilloscope 410 is connected between either the ohmic contacts 62 or 64 in this case it is shown connected to a contact 412 affixed to ohmic contact 62 (not shown) by a conductor 413, and the two emitters 52 and 54 are connected with the negative terminal of the power source 400 by conductors 414, 416 and 418; when the power source 400 is energized the scope of the oscilloscope will show a square wave pulse of the type illustrated in FIG. 2.

The following example is illustrative of the practice of this invention:

*Example*

A silicon wafer was cut from a previously prepared single crystal rod of phosphorus doped n-type silicon having a resistivity of 50 ohm-cm. The wafer was abraded and etched.

The wafer was then disposed in a diffusion furnace and diffused with aluminum vapor. The hottest zone of the furnace was at a temperature of about 1200° C. The zone of the furnace in which the crucible of boron was disposed was at a temperature of about 1200° C. The diffusion was carried out for approximately 17 hours. The wafer was then abraded and chemically etched until the diffused layer was removed from all but the top portion of the wafer. The wafer was 0.5 inch long, 0.25 inch wide, 0.005 inch thick and had a p-n junction 0.7 mil from the top.

Two emitter forming foils having a thickness of 1 mil and comprised of 99.5% gold-0.5% antimony were disposed on the top surface of the wafer in the manner shown in FIG. 5. Two ohmic contact forming foils having a thickness of approximately 1 mil and comprised of 99% gold-1% boron were spread on the top surface of the wafer in the manner shown in FIG. 5. In addition, a foil comprised of 99% gold-1% boron and having a thickness of about 1 mil was disposed on the top surface of the wafer with a portion thereof extending over one edge of the wafer. Two ohmic contact forming foils having a thickness of about 1 mil and comprised of 99.5% gold and 0.5% antimony were disposed on the bottom surface of the wafer in the manner shown in FIG. 6. In addition, a foil comprised of 99.5% gold-0.5% antimony and having a thickness of about 1 mil was disposed on the bottom surface of the wafer between the two ohmic contact forming foils. A portion of the gold foil extended over the same edge of the wafer as the gold foil on the top surface.

The various foils were then fused to and alloyed with the wafer at a temperature of about 700° C. in a vacuum of $10^{-5}$ mm. Hg.

The top surface of the wafer was then coated with Apiezon wax. Lines were scribed entirely through the wax coating in the same manner as that illustrated in FIG. 7. The top surface of the wafer was then etched with an etchant comprised of 3 parts nitric acid, 1 part hydrofluoric acid and 1 part acetic acid, all being concentrated acids. The etching was continued until the lines scribed in the wax were etched through the diffusion formed p-type region to the n-type region. The etching was then terminated and the wax removed from the upper surface of the wafer.

The positive electrode of a 3 volt direct current power source was attached to the ohmic gold contact. The negative terminal of the direct current power source was attached to an electrical conductor disposed between the two emitters on the upper surface of the wafer. An oscilloscope was connected between the negative electrode of the direct current power source and one of the ohmic contacts disposed on the bottom of the wafer. When the direct current power source was activated a square wave pulse pattern was observed on the scope of the oscilloscope. The pulse wave was a square wave of the type illustrated in FIG. 2 and had a frequency of 250 kc.

The astable multivibrator of this invention may be employed as a D.C. to A.C. converter.

While the invention has been described with reference to particular embodiments and examples, it will be understood that modifications, substitutions and the like may be made therein without departing from its scope.

I claim as my invention:

1. A monolithic astable multivibrator semiconductor device comprising a unitary body of a semiconductor material, said body containing a top region of a first type of semiconductivity and a bottom region of a second type of semiconductivity, a first p-n junction between the bottom surface of the top region and the top surface of the bottom region, a first and a second ohmic contact disposed on the top surface of the top region, two regions of an opposite type of semiconductivity formed on the top surface of the top region between the first and second ohmic contacts, a p-n junction between each of the two regions of opposite type semiconductivity and the top region of the body, a third ohmic contact disposed upon a portion of the top surface of the top region and extending about one edge of the body of semiconductor material and forming an ohmic contact with the bottom surface of the bottom region, a first groove in the top surface of the top region about the edge thereof, said first groove beginning and terminating at the third ohmic contact, said first groove extending entirely through the top region of the body to the bottom region, a second groove in the top surface extending parallel to and inside of a first segment of said first groove, said second groove extending entirely through said top region to said bottom region, a third groove in the top surface extending from said second groove to a second segment of the first groove, said second segment being substantially parallel to said first segment of said first groove, said third groove extending entirely through said top region to said bottom region, and dividing and insulating, relative to said top region one of the aforesaid ohmic contacts and one of the aforesaid area of second-type of semiconductivity disposed upon the top surface of the top region from the other aforesaid ohmic contact and region of second type of semiconductivity disposed on the top surface of the top region, and two ohmic contacts disposed on the bottom surface of the bottom region.

2. A monolithic astable multivibrator semiconductor device comprising a unitary body of a semiconductor material, said body containing a top region of a first type of semiconductivity and a bottom region of a second-type of semiconductivity, a first p-n junction between the bottom surface of the top region and the top surface of the bottom region, a first and a second ohmic contact disposed on the top surface of the top region, one region of an opposite type of semiconductivity formed on the top surface of the top region between the first and second ohmic contacts, a p-n junction between the region of opposite type semiconductivity and the top region of the body, a third ohmic contact disposed upon a portion of the top surface of the top region and extending about one edge of the body of semiconductor material and forming an ohmic contact with the bottom surface of the bottom region, a groove disposed upon the top surface of the top region about the edge thereof, said first groove beginning and terminating at the third ohmic contact, said first groove extending entirely through the top region of the body to the bottom region, a second groove extending parallel to and inside of a first segment of said first groove, said second groove extending entirely through said top region to said bottom region, a third groove extending from said second etched line and separating a portion of the area of opposite type of semiconductivity on the top surface of the top region from the first ohmic contact, and a fourth groove extending from a segment of the first groove and separating a portion of the area of opposite type of semiconductivity of the top surface of the top region from the second ohmic contact on the top surface of the top region of the wafer, and two ohmic contacts disposed on the bottom surface of the bottom region.

3. In a semiconductor device capable of providing the functions of a plurality of conventionally interconnected components, the structure comprising: a unitary body of semiconductor material including a substrate of a first type of semiconductivity having a layer of material of a second type of semiconductivity thereon and forming a p-n junction therewith; first and second regions of material of said first type of semiconductivity disposed on said layer and forming p-n junctions therebetween; first and second ohmic contacts disposed on said layer symmetrically with respect to said first and second regions; third and fourth ohmic contacts disposed on the opposite surface of said substrate from said layer; said third ohmic contact opposing a first portion of said first ohmic contact, a first portion of said second ohmic contact larger in area than said first portion of said first ohmic contact and said first region; said fourth ohmic contact opposing a second portion of said second ohmic contact, a second portion of said first ohmic contact larger in area than said second portion of said second ohmic contact and said second region; said first region, a first portion of said layer and a first portion of said substrate cooperating to function as emitter, base and collector regions, respectively, of a first transistor; said second region, a second portion of said layer and a second portion of said substrate cooperating to function as emitter, base and collector regions, respectively, of a second transistor; said first ohmic contact serving as a base contact on said first transistor and also as a first plate of a first capacitor; said second ohmic contact serving as a base contact on said second transistor and also as a first plate of a second capacitor; said third ohmic contact serving as a collector contact on said first transistor and also as a second plate of said second capacitor; said fourth ohmic contact serving as a collector contact on said second transistor and also as a second plate of said first capacitor so that said structure provides the functions of two transistors with the base region of each capacitively coupled to the collector region of the other.

4. In a semiconductor device, the structure in accordance with claim 3 wherein: said first and second ohmic contacts are of like shape and equal area and said third and fourth ohmic contacts are of like shape and equal area so that said first and second transistors have closely similar characteristics and said first and second capacitors have closely similar characteristics.

5. In a semiconductor device, the structure in accordance with claim 4 wherein: said first and second regions are united to provide a common emitter for said first and second transistors.

6. In a semiconductor device, the structure in accordance with claim 3 wherein: additional portions of said layer serve as first and second resistances between the base regions of said first and second transistors and additional portions of said substrate serve as third and fourth resistances between the collector regions of said first and second transistors.

7. In a semiconductor device, the structure in accordance with claim 6 wherein: contact means are provided on said layer and said substrate for the application of a bias potential to a point between said first and second resistances and between said third and fourth resistances.

References Cited in the file of this patent

UNITED STATES PATENTS 2,816,228 Johnson -------------- Dec. 10, 1957

OTHER REFERENCES

Article in Electronics, by Kilby, pages 110–111, Aug. 7, 1959.

Article in Electronics, by Langford, pages 49–52, Dec. 11, 1959.